(12) United States Patent
Luu

(10) Patent No.: US 6,480,465 B1
(45) Date of Patent: Nov. 12, 2002

(54) AM TRANSMITTER HAVING FEED-FORWARD CORRECTION TO COMPENSATE FOR SOURCE IMPEDANCE

(75) Inventor: Ky Thoai Luu, Mason, OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/894,604

(22) Filed: Jun. 28, 2001

(51) Int. Cl.$^7$ ............................................. H03F 1/14
(52) U.S. Cl. ..................... 370/51; 330/124 R; 330/295; 330/129
(58) Field of Search ............................. 330/51, 124 R, 330/129, 295

(56) References Cited

U.S. PATENT DOCUMENTS

| | | | |
|---|---|---|---|
| 4,580,111 A | 4/1986 | Swanson | 332/41 |
| 4,949,050 A | 8/1990 | Swanson | 330/298 |

OTHER PUBLICATIONS

Greenough et al. "Design of the Final Power Amplifier Stage for the 30 MHZ TFTR FMIT RF Sources" Fusion Engineering 1997, 17th IEEE/NPSS Symposium, vol. 1, 1998 pp. 452–455 vol. 1.*

* cited by examiner

Primary Examiner—Michael Shingleton
(74) Attorney, Agent, or Firm—Tarolli, Sundheim, Covell, Tummino & Szabo L.L.P.

(57) ABSTRACT

An AM transmitter having feed forward correction to compensate for source impedance. A power supply source provides a DC operating voltage. N RF amplifiers are provided for amplifying an input signal. The amplifiers are connected to the power supply source. Each amplifier has an output circuit that, when the associated amplifier is on, supplies energy from the source to provide an output voltage at a load. Each the amplifier output circuit exhibits a source impedance that degrades the value of the output voltage. A source impedance corrector varies the value of the input signal prior to amplification by the amplifiers to compensate for any variations in the value of the output voltage caused by the source impedances.

9 Claims, 3 Drawing Sheets

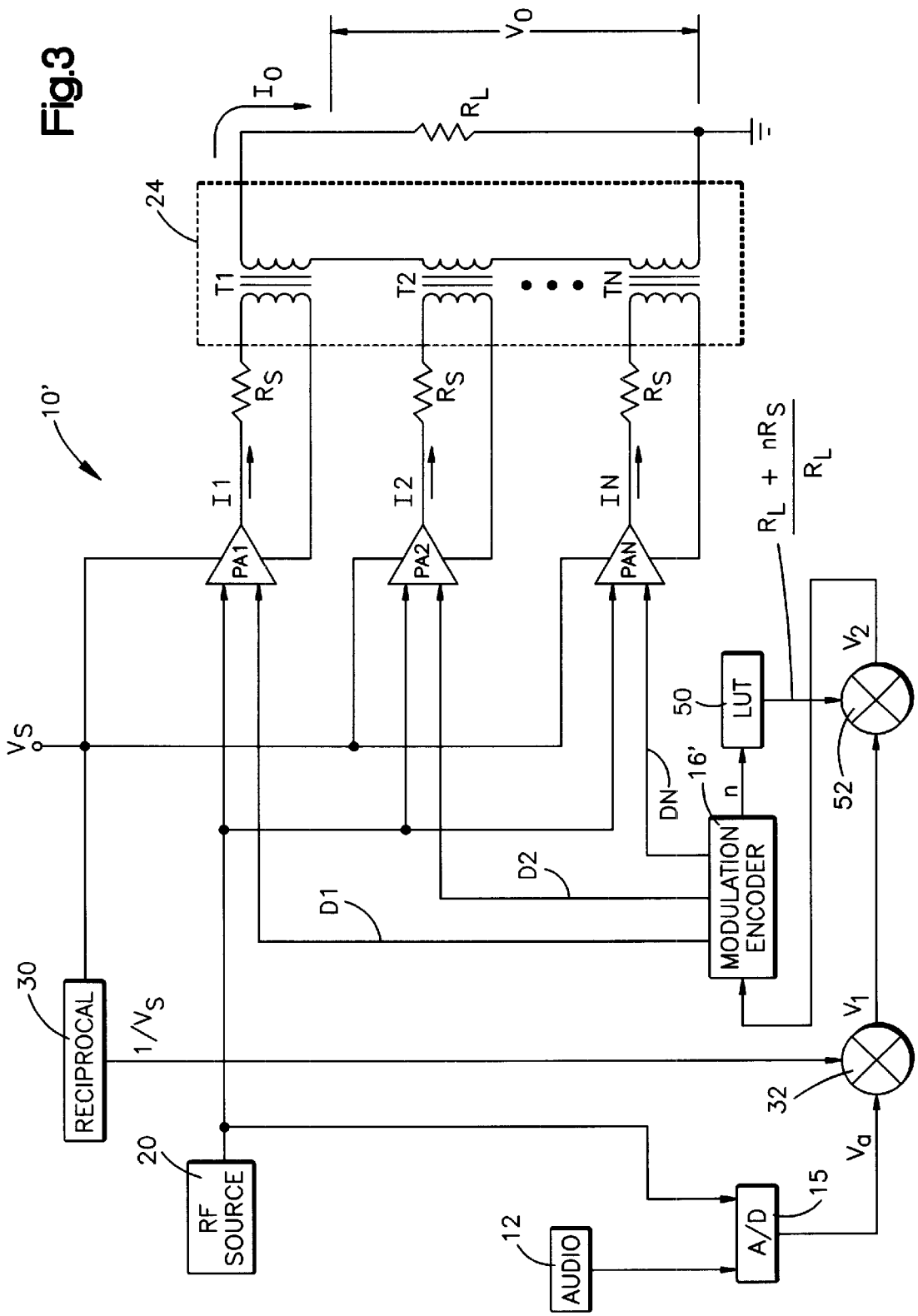

AM TRANSMITTER HAVING FEED-FORWARD CORRECTION TO COMPENSATE FOR SOURCE IMPEDANCE

BACKGROUND OF THE INVENTION

1. Technical Field

This invention relates to the art of radio broadcasting and, more particularly, to an AM transmitter provided with feed-forward correction to compensate for source impedance.

2. Description of the Prior Art

The U.S. Patents to H. I. Swanson U.S. Pat. Nos. 4,580, 111 and 4,949,050 disclose an amplitude modulator for use in AM radio broadcasting and wherein the modulator serves to generate an amplitude modulated signal by selectively turning on and off a plurality of RF amplifiers in digital manner to produce amplitude modulation. Each of the RF amplifiers provides an output voltage across the primary winding of a transformer. The secondary windings of the transformers are connected together in series in a series combiner. Output current flows in the secondary windings to supply a load, such as an antenna, for broadcasting an RF signal.

In such a system as noted above, a power supply provides DC operating voltage to the plurality of RF amplifiers. Since the magnitude of the power supply may vary somewhat over a period of time, it is known to provide power supply compensation by means of a corrector that supplies the reciprocal value of the power supply voltage to the input signal prior to amplification. This compensates for any variations in the value of the power supply voltage. However, this feed-forward power supply variation compensation overlooks the error caused by the source impedance as presented to the output load by the amplifiers. This is an error that results in non-linear amplification of the input signal resulting in distortion.

SUMMARY OF THE INVENTION

In accordance with the present invention an AM transmitter is provided having feed-forward correction to compensate for source impedance. The transmitter includes a power supply source for providing a DC operating voltage. N RF amplifiers are provided for amplifying an input signal. The amplifiers are connected to the power supply source with each amplifier having an output circuit that, when the associated amplifier is on, supplies energy from the source to provide an output voltage at a load. Each amplifier output circuit exhibits a source impedance that degrades the value of the output voltage. A source impedance corrector varies the value of the input signal prior to amplification by the amplifiers in order to compensate for any variations in the value of the output voltage caused by the source impedances.

BRIEF DESCRIPTION OF THE DRAWINGS

The foregoing and other objects and advantages of the present invention will become more readily apparent from the following description as taken in conjunction with the accompanying drawings, wherein:

FIG. 3 is a schematic-block diagram illustration in accordance with the present invention.

DESCRIPTION OF THE PREFERRED EMBODIMENT

One application of the present invention is in conjunction with RF power amplifiers employed in an AM broadcast transmitter. An example of such a transmitter is presented in FIG. 1 and takes the form of a digital amplitude modulator such as that illustrated in the aforesaid U.S. Pat. No. 4,580, 111 which is assigned to the same assignee as the present invention and the disclosure of that patent is herein incorporated by reference.

Figure 1:
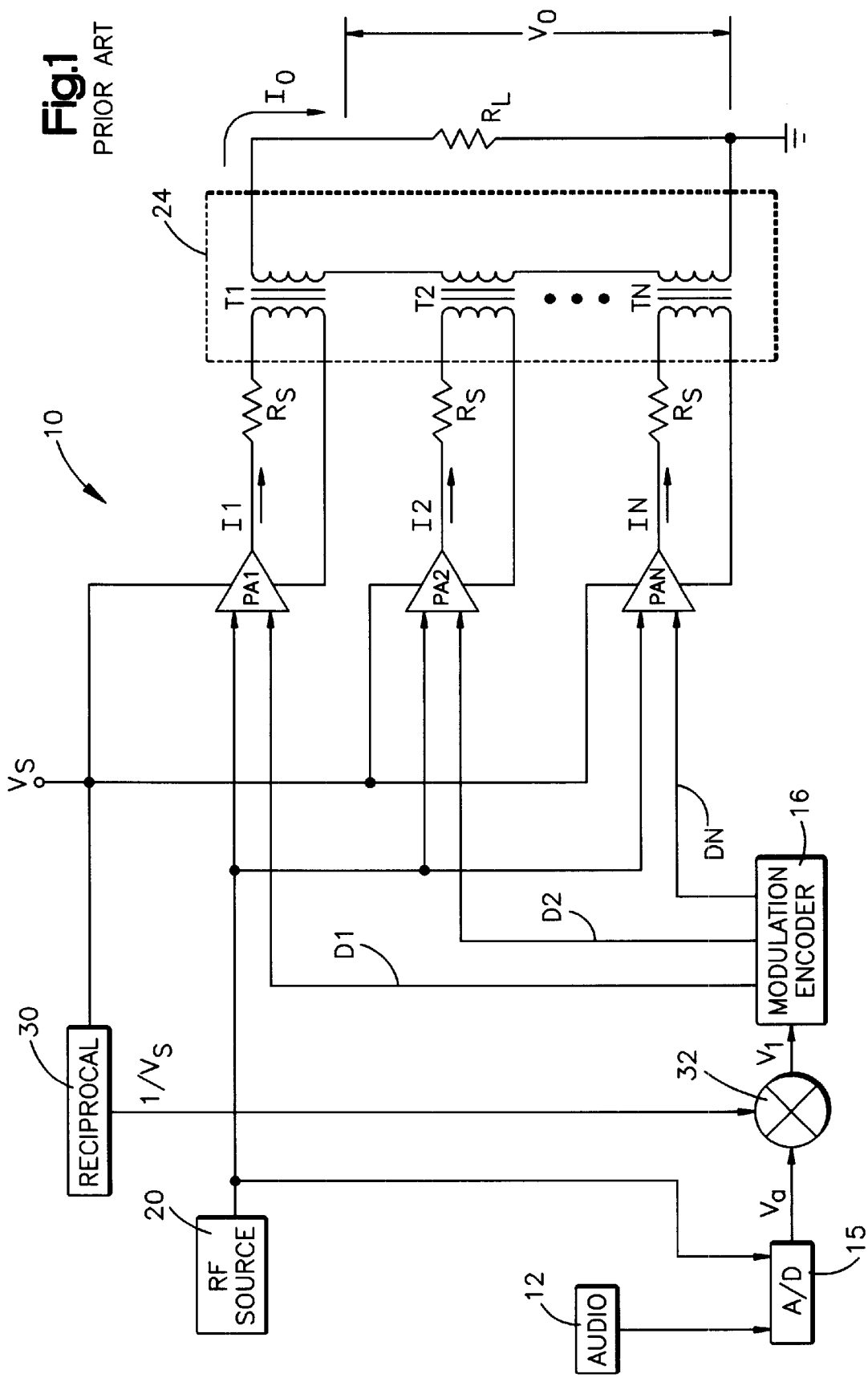
FIG. 1 is a prior art schematic-block diagram illustration of one application to which the present invention may be applied.

Referring now to FIG. 1, the amplitude modulator 10 is illustrated as receiving an input signal from an input source 12, which may be the source of an audio signal. Modulator 10 amplitude modulates an RF carrier signal with the input signal. The modulation is a function of the amplitude of the input signal. The amplitude modulated carrier signal is provided on an output line connected to a load $R_L$, which may take the form of an RF transmitting antenna. A controller including a modulation encoder 16 provides a plurality of digital control signals D1–DN. The control signals are binary signals each having a binary 1 or a binary 0 level. The number of signals having binary 1 or binary 0 levels is dependent upon the instantaneous level of the input signal which is digitized by an analog to digital converter 15. Thus, the greater the input signal the more control signals having a binary 1 level.

Each of the control signals D1–DN is supplied to one of a plurality of N RF power amplifiers PA1–PAN. The control signals serve to turn associated power amplifiers either on or off. Thus, if the control signal has a binary 0 level, then its associated amplifier is inactive and no signal is provided at its output. However, if the control signal is of a binary 1 level, then the power amplifier is active and the amplified carrier signal is provided as its output. Each power amplifier has an input connected to the signal common RF source 20 so that each amplifier PA1–PAN, when on, receives a signal of like amplitude and phase and frequency. The carrier signals may be square waves. The outputs of the power amplifier are supplied to a combiner circuit 24 comprised of a plurality of transformers T1, T2 . . . TN. The secondary windings act as an independent signal source, whereby the signals provided by the various transformers additively combine with one another to produce a combined signal which is supplied to the load $R_L$. This combined signal has the same frequency as the RF signal supplied by the RF source 20, but the amplitude of the combined signal is modulated in accordance with the input signal supplied by the input source 12.

While the transmitter is operating, some of the power amplifiers PA—PAN are turned on. This is represented in FIG. 1 wherein the currents I1, I2 . . . IN are flowing in the primary windings of transformers T1, T2 . . . TN. Current flowing in the primary windings causes current to be induced in the secondary windings providing a combined output current $I_o$ that flows through the load $R_L$ providing an output voltage $V_O$.

Preferably, the output voltage $V_0$ is an amplified version of the input voltage supplied to the modulation encoder 16. However, it is known that the operating voltage $V_s$ varies in time and consequently a non-linear output voltage results. It has been known to compensate for such voltage drifts by applying a signal which is a reciprocal of the voltage source to a multiplier prior to the encoder 16. This is illustrated in FIG. 1 wherein a reciprocal circuit 30, which may take the form of a look-up table, is connected to the operating voltage source $V_s$ and provides the reciprocal value thereof to a multiplier 32 which multiplies the input voltage $V_A$ by the reciprocal of the voltage source $V_s$ to obtain a voltage $V_1$ where:

$$V_1 = \frac{V_a}{V_s} \qquad \text{EQUATION 1}$$

where: $V_a$: is input sinusoidal voltage signal
$V_s$: power supply DC voltage

From the above it is seen that $V_1$ is the product result of the input signal $V_a$ and the reciprocal of the power supply i.e., $1/V_s$. As the power supply is fluctuating, $V_1$ is correcting in the opposite direction. This ensures a constant output level regardless of power supply variations. As the power supply voltage decreases, the value of $V_1$ increases and this allows more amplifiers to be turned on. In this example, the output voltage $V_0$ at the load $R_L$ is defined as follows:

$$V_0 = GV_S \frac{R_L}{R_L + nR_S} \quad V_1 = GV_a \frac{R_L}{R_L + nR_s} \qquad \text{EQUATION 2}$$

where: $V_a$: input sinusoidal voltage signal
G: gain of the power amplifier
$V_s$: power supply potential
$R_L$: load resistance
$R_s$: source impedance
n: number of power amplifiers that are turned on.

An advantage of such a serial combining system as set forth in FIG. 1 is it's simplicity. It operates with a very wide bandwidth (greater than 100 kHz) and no feedback loop is required. The circuit has good transient response and is very stable. The number of amplifiers that are turned on and off varies in proportion to the magnitude of the input sinusoidal voltage signal $V_a$. The number of power amplifiers that are turned on is linearly proportional to the magnitude of the input voltage $V_a$. During this amplitude modulation, the total source impedance from the combined power amplifiers also changes linearly and results in error if this feed-forward is employed. Specifically, the system of FIG. 1 overlooks a critical error: namely the magnitude of the ratio $$\frac{R_L}{R_L + nR_s}.$$

Thus, the source impedance error of the combined power amplifiers presents losses. The power amplifiers are not ideal and losses due to operation is a factor to be considered and it is also a significant contributor to signal peak envelop distortion.

Figure 2:
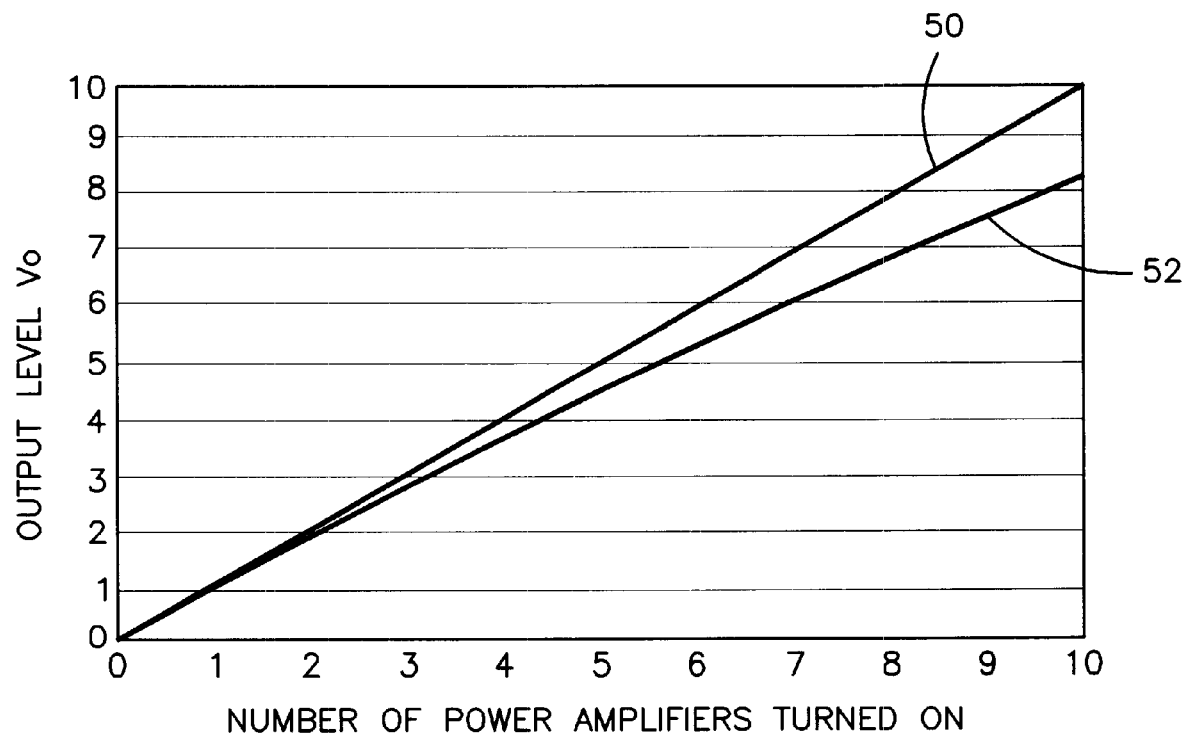
FIG. 2 is a graphical illustration of output voltage magnitude with respect to the number of power amplifiers employed and illustrating the results wherein the source impedance is equal to zero and when the source impedance is equal to 2% of the load impedance.

Reference is now made to FIG. 2. This figure includes curves 50 and 52 each illustrates the output voltage $V_0$ with respect to the number of power amplifiers N that are turned on in a range of amplifiers of 1–10. In this illustration, curve 50 shows a linear relationship between the output voltage $V_0$ and the number of power amplifiers that are turned on. The value of the source impedance $R_s$ is equal to zero. Curve 52 is for a source impedance of 0.02 $R_L$ (this is 2% of the load resistance $R_L$). Note the gap between curves 50 and 52 for just a 2% source impedance. Clearly, source impedance results in a non-linear output voltage $V_0$ and it becomes particularly noticeable the more power amplifiers that are turned on.

From the foregoing, it is seen that the source impedance degrades the value of the output voltage $V_0$. In accordance with the present invention this error is corrected by varying the value of the input signal prior to amplification by the power amplifiers to compensate for any variations in the value of the output voltage caused by the source impedance. This is accomplished with the circuitry illustrated in FIG. 3 to which attention is now directed.

The embodiment illustrated in FIG. 3 is similar to that as illustrated in FIG. 1 and to simplify the description herein, like components in FIGS. 1 and 3 are identified with like character references. Only the differences between FIGS. 1 and 3 will be described below in detail.

The transmitter 10' in FIG. 3, as in the case of the transmitter 10 in FIG. 1, includes a reciprocal circuit 30, which may take the form of a look-up table, provides the reciprocal of the supply source $V_s$ to a multiplier 32 to obtain the voltage signal $V_1$ described hereinabove. In accordance with the present invention, the signal $V_1$ is multiplied by the reciprocal of the error term shown in EQUATION 2. Thus, $V_2$ takes the form of:

$$V_2 = \frac{V_a}{V_s}\left(\frac{R_L + nR_s}{R_L}\right) \qquad \text{EQUATION 3}$$

where: n is the number of power amplifiers that are turned on.

The reciprocal error term is obtained from a look-up table 50 which is provided with a multi-digit address corresponding to n (the number of power amplifiers that are turned on) and this term n is obtained from the modulation encoder 16'. This error term is supplied by the look-up table 50 to a multiplier 52 that multiplies the error term from the look-up table with the signal $V_1$ to obtain signal $V_2$.

With the signal $V_2$ being supplied prior to the amplification, the output voltage $V_0$ now appears as shown below:

$$V_0 = GV_s \frac{R_L}{R_L + nR_s} \quad V_2 = GV_a \qquad \text{EQUATION 4}$$

From EQUATION 4 it is seen that the net result is that the output signal is now linearly tracking the input audio signal $V_a$ with both power supply variations and source impedance errors eliminated. Because of this improvement, the system is more accurate and linear than the system illustrated in FIG. 1. The total harmonic distortion of the output signal is improved.

Although the invention has been described in conjunction with a preferred embodiment, it is to be appreciated that various modifications may be made without departing from the spirit and scope of the invention as defined by the appended claims.

Having described the invention, I claim:
1. An AM transmitter having feed forward correction to compensate for source impedance comprising:
   a power supply source for providing a DC operating voltage;
   N RF amplifiers for amplifying an input signal, said amplifiers being connected to said power supply source with each said amplifier having an output circuit that, when the associated amplifier is on, supplies energy from said source to provide an output voltage at a load and wherein each said amplifier output circuit exhibits a source impedance that degrades the value of said output voltage; and, source impedance corrector that varies the value of said input signal prior to amplification by said amplifiers to compensate for any variations in the value of said output voltage caused by said source impedances.

2. An AM transmitter as set forth in claim 1 wherein said corrector varies the value of said input signal in dependence upon the number of said amplifiers that are turned on.

3. An AM transmitter as set forth in claim 1 including a controller that selectively turns on one or more of a plurality of said amplifiers with the number that are turned on being a function of said input signal.

4. An AM transmitter as set forth in claim 3 wherein the controller turns on a number of said amplifiers in direct proportion to the value of said input signal.

5. An AM transmitter as set forth in claim 4 wherein said corrector varies the value of said input signal in dependence upon the number of said amplifiers that are turned on.

6. An AM transmitter as set forth in claim 3 wherein the controller turns on a number of amplifiers in a linear relationship to the value of said input signal.

7. An AM transmitter as set forth in claim 6 wherein said corrector varies the value of said input signal in dependence upon the number of said amplifiers that are turned on.

8. An AM transmitter as set forth in claim 7 wherein n represents the number of amplifiers that are turned on and wherein said corrector includes a look-up table and provides for each value of n a correction factor that is multiplied by said input signal to provide a corrected input signal prior to amplification.

9. An AM transmitter as set forth in claim 8 wherein said input signal is $$\frac{R_L + nR_s}{R_L}$$

wherein $R_L$ represents the impedance of said load and $R_s$ represents the source impedance of each said amplifier output circuit.

* * * * *